(12) United States Patent
Teboulle et al.

(10) Patent No.: US 11,761,997 B2
(45) Date of Patent: Sep. 19, 2023

(54) SYSTEM COMPRISING AN ELECTRICITY METER AND A CIRCUIT BREAKER

(71) Applicant: SAGEMCOM ENERGY & TELECOM SAS, Rueil Malmaison (FR)

(72) Inventors: Henri Teboulle, Rueil Malmaison (FR); Christophe Grincourt, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 16/634,724

(22) PCT Filed: Jul. 4, 2018

(86) PCT No.: PCT/EP2018/068159
§ 371 (c)(1),
(2) Date: Jan. 28, 2020

(87) PCT Pub. No.: WO2019/034324
PCT Pub. Date: Feb. 21, 2019

(65) Prior Publication Data
US 2020/0209293 A1    Jul. 2, 2020

(30) Foreign Application Priority Data

Aug. 18, 2017 (FR) ...................... 1757760

(51) Int. Cl.
*G01R 22/10* (2006.01)
*G01R 19/165* (2006.01)
(Continued)

(52) U.S. Cl.
CPC ........... *G01R 22/10* (2013.01); *G01R 19/165* (2013.01); *H01H 71/10* (2013.01);
(Continued)

(58) Field of Classification Search
CPC ...... G01R 22/10; G01R 19/165; H01H 71/10; H02H 1/0007; H02H 1/0061; H02H 1/0092; H02H 7/22
(Continued)

(56) References Cited

U.S. PATENT DOCUMENTS

2007/0055889 A1    3/2007  Henneberry et al.
2007/0055898 A1*   3/2007  Goh ..................... G06F 13/4077
                                                        713/300
(Continued)

FOREIGN PATENT DOCUMENTS

CN        202513107 U  * 10/2012
CN        202948040 U  *  5/2013
(Continued)

OTHER PUBLICATIONS

Amit Jain, Mohnish Bagree, A prepaid meter using mobile communication, International Journal of Engineering, Science and Technology, vol. 3, No. 3, 2011, pp. 160-166 (Year: 2011).*

(Continued)

*Primary Examiner* — Thienvu V Tran
*Assistant Examiner* — Sreeya Sreevatsa
(74) *Attorney, Agent, or Firm* — Muncy, Geissler, Olds & Lowe, P.C.

(57) ABSTRACT

A system comprising a meter and a circuit breaker, the electricity meter comprising: a primary processing component designed to acquire a primary power supply parameter and to produce, from the primary power supply parameter, a primary command intended to control the opening or closure of a line; a primary transceiver designed to transmit the primary command; the circuit breaker comprising: a disconnection unit; a bistable relay designed to open or close the disconnection unit; a secondary receiver designed to receive the primary command; a secondary processing com- (Continued)

ponent designed to acquire the primary command and to control the bistable relay so as to open or close the disconnection unit on the basis of the primary command.

12 Claims, 2 Drawing Sheets

(51) Int. Cl.
  *H01H 71/10* (2006.01)
  *H02H 1/00* (2006.01)
  *H02H 7/22* (2006.01)

(52) U.S. Cl.
  CPC ........ *H02H 1/0007* (2013.01); *H02H 1/0061* (2013.01); *H02H 1/0092* (2013.01); *H02H 7/22* (2013.01)

(58) Field of Classification Search
  USPC .......................................................... 361/86
  See application file for complete search history.

(56) References Cited

U.S. PATENT DOCUMENTS

| | | | | |
|---|---|---|---|---|
| 2007/0299562 | A1* | 12/2007 | Kates | H02J 3/14 700/295 |
| 2008/0167755 | A1* | 7/2008 | Curt | H02J 13/0075 700/293 |
| 2008/0195794 | A1* | 8/2008 | Banker | G01R 21/133 711/E12.001 |
| 2010/0076616 | A1* | 3/2010 | Kagan | G01R 19/2513 710/110 |
| 2012/0206851 | A1* | 8/2012 | Weber | H01H 9/56 361/195 |
| 2013/0039229 | A1* | 2/2013 | Park | H04B 1/005 370/280 |
| 2015/0070507 | A1 | 3/2015 | Kagan | |
| 2015/0247900 | A1* | 9/2015 | Shuey | G01R 22/065 324/415 |
| 2017/0169979 | A1 | 6/2017 | Mittelstadt | |
| 2018/0130618 | A1* | 5/2018 | Ramirez | H01H 9/56 |

FOREIGN PATENT DOCUMENTS

| | | | | |
|---|---|---|---|---|
| CN | 204858747 U | * | 12/2015 | |
| DE | 10210321 A1 | * | 11/2002 | ............... H01H 9/40 |
| DE | 10210321 A1 | * | 11/2002 | ............... H01H 9/40 |
| EP | 0814555 A1 | * | 6/1997 | |
| EP | 0814555 A1 | * | 6/1997 | |
| EP | 814555 A1 | * | 12/1997 | ............... H02H 1/06 |
| FR | 0814555 A1 | * | 12/1997 | |
| KR | 19990077643 A | * | 10/1999 | ........ H02J 13/00006 |
| KR | 19990077643 A | * | 10/1999 | |
| WO | WO-2007056878 A1 | * | 5/2007 | ........... G01R 22/065 |

OTHER PUBLICATIONS

A prepaid meter using mobile communication, Amit Jain, Mohnish Bagree, International Journal of Engineering, Science and Technology, vol. 3, No. 3, 2011, pp. 160-166 (Year: 2011).*

* cited by examiner

SYSTEM COMPRISING AN ELECTRICITY METER AND A CIRCUIT BREAKER

The invention relates to the field of systems comprising an electricity meter and a circuit breaker.

BACKGROUND OF THE INVENTION

A modern electricity meter, sometimes referred to as a "smart" meter, is, of course, adapted to measuring the quantity of electrical energy that is supplied by a distributor to an electrical installation via an electricity distribution network, however it is also capable of performing a certain number of additional functions: managing tariffs by receiving orders, remote meter reading and programming, customer information, etc.

Such an electricity meter naturally includes current and voltage sensors. The current and voltage sensors measure the quality of electrical energy that is supplied to the electrical installation. The current and voltage sensors may also be used to monitor the voltage across the terminals of the electrical installation.

Such an electricity meter also includes a cut-off member serving to make it possible, remotely, for the electrical installation to be selectively connected to or disconnected from the electricity distribution network.

In particular, the cut-off member is used for the purpose of protecting the electrical installation by opening whenever it is subjected to an accidental voltage surge coming from the electricity distribution network, and for re-closing on instruction from an operative of the distributor following the accidental voltage surge. The cut-off member is thus used remotely for cutting off or for re-establishing the supply of power to the electrical installation, e.g. in the event of the user of the electrical installation cancelling a subscription, or failing to comply with the subscription contract, or failing to pay for the electrical energy that has been consumed, and to do so without any need for personnel to be sent to the site.

Such an electricity meter also includes a communication module for communicating externally relative to the electricity meter, e.g. with a user of electrical installation, with an operative of the distributor, with an information system (IS) of the distributor, or indeed with a data concentrator connected to a plurality of electricity meters. The communication module performs communication by powerline carrier or by any other type of wired or wireless communication.

Finally, such an electricity meter includes one or more processor components for managing the operation of the electricity meter, and also power supply components that power the various electrical components of the electricity meter.

Thus, such an electricity meter has a large number of components. These components enable the electricity meter to perform numerous functions, but they also tend to increase the weight, the size, and the cost of the electricity meter, and to reduce its reliability.

OBJECT OF THE INVENTION

An object of the invention is to reduce the weight, the size, and the cost of an electricity meter, and to increase its reliability.

SUMMARY OF THE INVENTION

In order to achieve this object, there is provided a system comprising an electricity meter and a circuit breaker for including in a line connecting an electricity distribution network to an electrical installation, the electricity meter comprising:
- a primary processor component arranged to acquire a primary power supply parameter relating to supplying power to the electrical installation, and, on the basis of the primary power supply parameter, to produce a primary command for controlling opening or closing of the line; and
- a primary transceiver arranged to transmit the primary command;

the circuit breaker comprising:
- a cut-off member for cutting off the line;
- a bistable relay arranged to open or to close the cut-off member;
- a secondary receiver arranged to receive the primary command;
- a secondary processor component arranged to acquire the primary command and to control the bistable relay so as to open or close the cut-off member as a function of the primary command.

In the system of the invention, the electricity meter makes use of the cut-off member of the circuit breaker in order to cut off the line on the occurrence of an event that would have led to a conventional electricity meter (having its own cut-off member) to cut off the line. Likewise, the electricity meter makes use of the cut-off member of the circuit breaker in order to re-close the line. The electricity meter uses the primary transceiver for transmitting the primary command to the circuit breaker, which receives the primary command via the secondary receiver.

Thus, there is no need to provide the electricity meter with a cut-off member. This serves to reduce the weight and the size of the electricity meter. The costs of developing and manufacturing the electricity meter are also reduced. Furthermore, the cost of the circuit breaker is not greatly increased, since the cut-off member used is a cut-off member as conventionally provided in a circuit breaker and presenting performance that has been tried and tested for a long time.

This significantly increases the reliability of the electricity meter. Specifically, the cut-off member can sometimes suffer problems of contact blackening that reduce its reliability and thus the reliability of a conventional electricity meter.

There is also provided a system as described above, wherein the primary power supply parameter comprises an opening request or a closing request produced by equipment external to the system and received by the primary processor component of the electricity meter via the primary transceiver.

There is also provided a system as described above, wherein the primary power supply parameter is a measurement of primary phase current, a measurement of primary neutral current, and/or a measurement of primary voltage as taken by the electricity meter.

There is also provided a system as described above, wherein the secondary processor component is also arranged to acquire a secondary power supply parameter relating to supplying power to the electrical installation, and, on the basis of the secondary power supply parameter, to produce a secondary command for causing the line to be opened or closed, and to control the bistable relay in such a manner as to open or close the cut-off member as a function of the secondary command.

There is also provided a system as described above, wherein the primary transceiver is a powerline carrier transceiver and the secondary receiver is a powerline carrier receiver.

There is also provided a system as described above, wherein the primary transceiver is a two-band transceiver and the secondary receiver is a single-band receiver.

There is also provided a system as described above, wherein the circuit breaker includes a secondary voltage sensor arranged to measure a downstream voltage downstream from the cut-off member.

There is also provided a system as described above, including means for pairing the electricity meter and the circuit breaker.

There is also provided a circuit breaker for including in a line connecting an electricity distribution network to an electrical installation, the circuit breaker comprising:
- a cut-off member for cutting off the line;
- a bistable relay arranged to open or to close the cut-off member;
- a secondary receiver arranged to receive a primary command as produced by an electricity meter included in the line;
- a secondary processor component arranged to acquire the primary command and to control the bistable relay so as to open or close the cut-off member as a function of the primary command.

There is also provided a circuit breaker as described above, wherein the secondary processor component is also arranged to acquire a secondary power supply parameter related to supplying power to the electrical installation, and, on the basis of the secondary power supply parameter, to produce a secondary command for causing the line to be opened or closed, and to control the bistable relay in such a manner as to open or close the cut-off member as a function of the secondary command.

There is also provided a monitoring method for monitoring a line connecting an electricity distribution network to an electrical installation, the monitoring method being performed in a circuit breaker as described above and comprising the steps of:
- receiving, via the secondary receiver, a primary command for controlling opening or closing of the line;
- controlling the bistable relay so as to open or close the cut-off member as a function of the primary command.

There is also provided a monitoring method as described above, further comprising the steps of:
- measuring a downstream voltage downstream from the cut-off member; if the absolute value of the downstream voltage is greater than a predetermined voltage threshold, and if the primary command is for causing the line to be closed, refusing to close the line.

There is also provided a computer program including instructions for enabling a processor component of a circuit breaker to perform the monitoring method as described above.

There are also provided storage means, characterized in that they store a computer program including instructions for enabling a processor component of a circuit breaker to perform the monitoring method as described above.

Other characteristics and advantages of the invention appear on reading the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
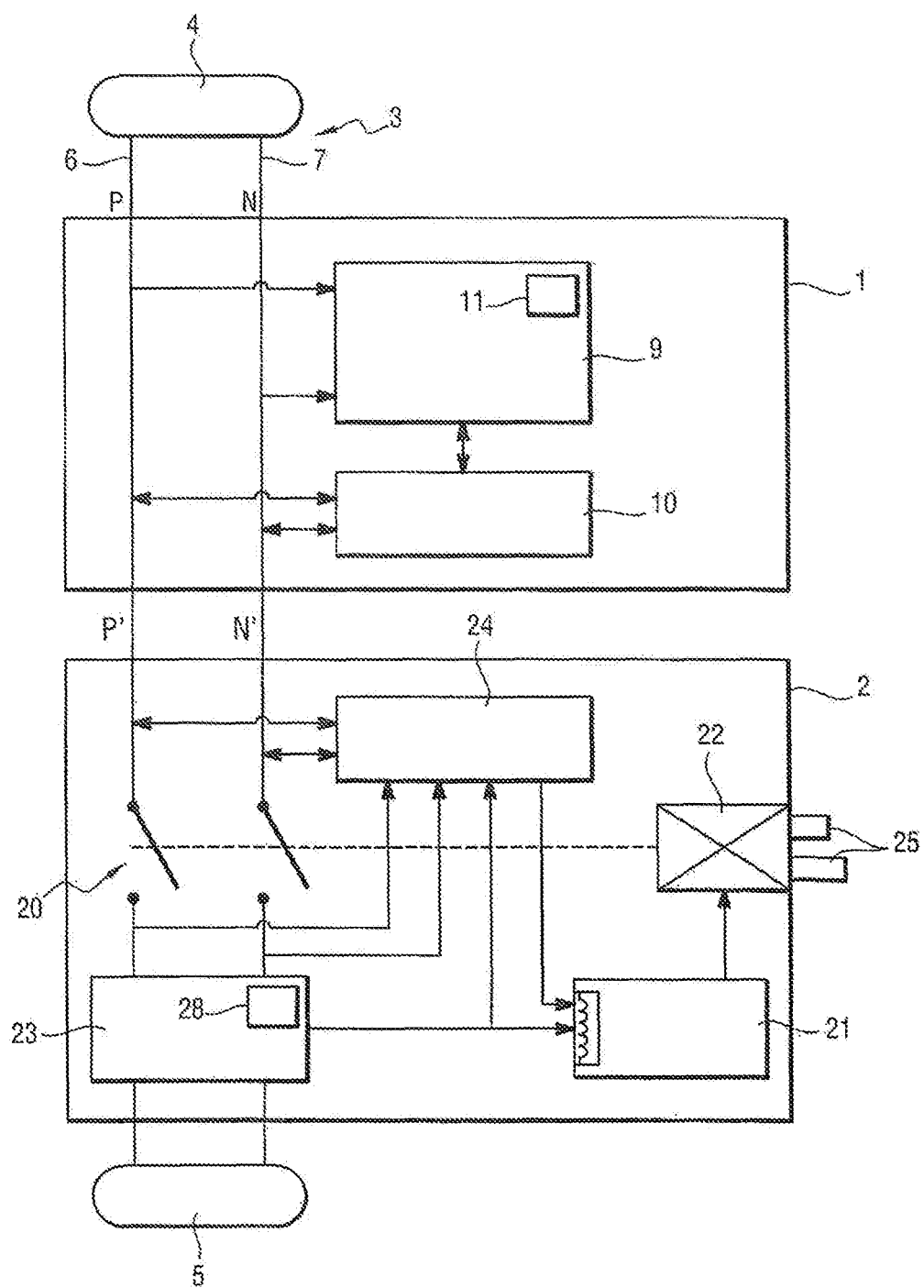
FIG. 1 shows an electricity meter and a circuit breaker of a system of the invention.

With reference to FIG. 1, the system of the invention comprises an electricity meter 1 and a circuit breaker 2.

The electricity meter 1 and the circuit breaker 2 are installed in a line 3 connecting an electricity distribution network 4 to an electrical installation 5. In this example, the line 3 is a single phase line comprising a phase conductor 6 and a neutral conductor 7.

In this example, the electricity meter 1 is located upstream from the circuit breaker 2. The term "upstream" is used herein to mean closer to the electricity distribution network 4, and the term "downstream" is used herein to mean closer to the electrical installation 5.

The system includes pairing means for pairing the electricity meter 1 with the circuit breaker 2. In this example, the pairing means comprise a connector and a pairing module positioned on and in the electricity meter 1. An operator can thus use an installation tool, such as a mobile terminal, to input the serial number of the circuit breaker 2 into the electricity meter 1. In this example, the serial number is transmitted by using the EURIDIS protocol.

The electricity meter 1 comprises a measurement block 9 and a primary transceiver 10.

The measurement block 9 comprises a current sensor for sensing current in the primary phase, a current sensor for sensing current in the primary neutral, a voltage sensor for sensing primary voltage, and primary processor means.

The primary phase current sensor measures primary phase current flowing in the phase conductor 6. The primary phase current sensor is connected to the phase conductor 6.

The primary neutral current sensor measures primary neutral current flowing in the neutral conductor 7. The primary neutral current sensor is connected to the neutral conductor 7.

The primary voltage sensor measures the primary voltage between the phase conductor 6 and the neutral conductor 7.

The primary processor means comprise a primary processor component 11 (e.g. a processor, a microcontroller, or a field programmable gate array (FPGA)). The primary processor component 11 manages the operation of the electricity meter 1, and in particular it acquires the primary phase current, primary neutral current, and primary voltage measurements as produced by the primary phase current sensor, by the primary neutral current sensor, and by the primary voltage sensor. In particular, the primary processor component 11 estimates the quantity of electrical energy supplied to the electrical installation 5.

In this example, the primary transceiver 10 is a powerline carrier transceiver. The primary transceiver 10 is capable of injecting communication signals between the phase conductor 6 and the neutral conductor 7, which signals become superposed on the primary phase-to-neutral voltage. The emitted signals present a frequency that is high compared with the frequency of the primary phase-to-neutral voltage, and they propagate between the phase conductor 6 and the neutral conductor 7. The emitted signals contain messages produced by the primary processor component 11.

In this example, the emitted signals are transmitted either to the circuit breaker 2 or to the distributor's information system (IS), or else to a data concentrator connected to a plurality of electricity meters.

The primary transceiver 10 can also receive communication signals that are superposed on the primary phase-to-neutral voltage. The received signals likewise present a frequency that is high compared with the frequency of the primary phase-to-neutral voltage, and they propagate between the phase conductor 6 and the neutral conductor 7.

The received signals come either from the circuit breaker 2, or from the IS, or else from the data concentrator (in which case they may be relayed by other intermediate meters), and they contain messages produced by the circuit breaker 2, by the IS, or by the data concentrator.

The primary transceiver 10 is a two-band transceiver, and it is arranged to emit the emitted signals and to receive the received signals both on a first frequency band and also on a second frequency band. In this example, the first frequency band is a band as defined by the CENELEC A standard. In this example, the second frequency band is a band defined by the Federal Communications Commission (FCC).

Powerline carrier communications over the first frequency band and over the second frequency band make use of modern protocols that are secure. It is thus very complicated for an ill-intentioned person or for a fraudster deliberately to degrade the operation of the electricity meter 1.

The circuit breaker 2 comprises a cut-off member 20, a bistable relay 21, an actuator member 22, a detector block 23, and a secondary transceiver 24.

The cut-off member 20 may be open or closed. When it is open, the cut-off member 20 cuts off the line 3 by opening both the phase conductor 6 and the neutral conductor 7, i.e. by preventing current from flowing both in the phase conductor 6 and also in the neutral conductor 7. When it is closed, the cut-off member 20 closes the line 3 and allows current to flow in the phase conductor 6 and in the neutral conductor 7.

The bistable relay 21 is arranged to open and to close the cut-off member 20 via the actuator member 22. By means of an opening command, using the bistable relay 21 enables the cut-off member 20 to be opened, and it then remains open until a closing command is applied. The closing command closes the cut-off member 20, which then remains closed until an opening command is applied.

The actuator member 22 also includes two pushbuttons 25 that make it possible to act manually, from outside the circuit breaker 2, to cut off or to re-initialize the circuit breaker 2, i.e. to open or to close the cut-off member 20 via the actuator member 22.

The detector block 23 includes a secondary phase current sensor, a secondary neutral current sensor, a secondary voltage sensor, and secondary processor means.

The secondary phase current sensor measures a secondary phase current flowing in the phase conductor 6. The secondary phase current sensor is connected to the phase conductor 6 downstream from the cut-off member 20.

The secondary neutral current sensor measures a secondary neutral current flowing in the neutral conductor 7. The secondary neutral current sensor is connected to the neutral conductor 7 downstream from the cut-off member 20.

The secondary voltage sensor measures a downstream voltage between the phase conductor 6 and the neutral conductor 7, downstream from the cut-off member 20.

The secondary processor means comprise a secondary processor component 28 (e.g. a processor, a microcontroller, or an FPGA). The secondary processor component 28 manages the operation of the circuit breaker 2 and in particular it acquires the secondary phase current, secondary neutral current, and downstream voltage measurements as produced by the secondary phase current sensor, by the secondary neutral current sensor, and by the secondary voltage sensor.

In this example, the secondary transceiver 24 is a powerline carrier transceiver.

The secondary transceiver 24 is capable of injecting emitted signals between the phase conductor 6 and the neutral conductor 7, which become superposed on the primary phase-to-neutral voltage. The emitted signals present a frequency that is high compared with the frequency of the secondary phase-to-neutral voltage, and they propagate between the phase conductor 6 and the neutral conductor 7.

In this example, the emitted signals are transmitted either to the electricity meter 1, or to the distributor's information system (IS) via the electricity meter 1, or else to the data concentrator, via the electricity meter. The emitted signals contain messages produced by the secondary processor component 28.

The secondary transceiver 24 may also receive received signals superposed on the secondary phase-to-neutral voltage. The received signals present a frequency that is likewise high compared with the frequency of the secondary phase-to-neutral voltage, and they propagate between the phase conductor 6 and the neutral conductor 7.

The received signals come either from the electricity meter 1, or from the IS (via the electricity meter), or else from the data concentrator (via the electricity meter 1), and they contain messages produced by the electricity meter 1, by the IS, or by the data concentrator.

In this example, the secondary transceiver 24 is a single band transceiver, and it is arranged to emit emitted signals and to receive received signals over a single frequency band. In this example, this frequency band is the second frequency band (as established by the FCC).

Powerline carrier communications over the second frequency band make use of modern protocols that are secure. It is thus very complicated for an ill-intentioned person or for a fraudster deliberately to degrade the operation of the circuit breaker 2.

The operation of the system of the invention is described in greater detail below.

In the system of the invention, the electricity meter 1 makes use of the cut-off member 20 of the circuit breaker 2 to cut off the line 3 when primary events occur that, in a conventional electricity meter (having a cut-off member), would lead to said conventional electricity meter using its own cut-off member for cutting off the line or for re-closing the line.

The primary processor component 11 of the electricity meter 1 is thus arranged to acquire primary power supply parameters relating to power being supplied to the electrical installation 5 in order to respond to each primary power supply parameter by producing a primary command for causing the line 3 to be opened or closed.

The primary power supply parameters thus correspond to the above-mentioned primary events.

The primary power supply parameters comprise an opening request and a closing request as produced by external equipment and received by the primary processor component 11 of the electricity meter 1 via the primary transceiver 10. In this example, the external equipment is the IS or the data concentrator.

Thus, when the IS considers that it is appropriate to cut off the supply of power to the electrical installation 5, e.g. in the event of the user of the electrical installation 5 terminating the subscription, the IS uses powerline carrier communication to transmit an opening request to the electricity meter 1, possibly via the data concentrator. The primary transceiver 10 receives the opening request. The primary processor component 11 then generates a primary command for causing the line 3 to be opened.

Likewise, when the IS considers that it is appropriate to re-establish the supply of power to the electrical installation 5, the IS uses powerline carrier communication to transmit a closing request. The primary processor component 11 then generates a primary command for causing the line 3 to be closed.

The primary power supply parameters also comprise a measurement of the primary phase current, a measurement of the primary neutral current, and a measurement of the primary voltage as taken by the electricity meter 1. Thus, when the primary processor component 11 detects that a power threshold has been exceeded, the primary processor component 11 generates a primary command for causing the line 3 to be opened.

Likewise, when the primary processor component 11 detects a return to normal, the primary processor component 11 generates a primary command for causing the line 3 to be closed.

The primary command generated by the primary processor component 11 is then transmitted by the primary transceiver 10 of the electricity meter 1 to the secondary transceiver 24 of the circuit breaker 2.

The secondary processor component 28 of the circuit breaker 2 then acquires the primary command and controls the bistable relay 21 so as to open or close the cut-off member 20 as a function of the primary command.

In this example, the powerline carrier communication between the electricity meter 1 and the IS or the data concentrator makes use of the first frequency band, whereas the powerline carrier communication between the electricity meter 1 and the circuit breaker 2 makes use of the second frequency band. This further increases the security of the system of the invention by making use of distinct frequency bands.

In the system of the invention, the circuit breaker 2 also makes use of the cut-off member 24 to cut off the line 3 when secondary events occur that, in a conventional circuit breaker, would lead to said conventional circuit breaker making use of its own cut-off member for cutting off the line or for re-closing the line.

The secondary processor component 28 of the circuit breaker 2 is thus arranged to acquire secondary power supply parameters relating to the supply of power to the electricity installation 5 in order to respond to the secondary power supply parameters by producing a secondary command for causing the line 3 to be opened or closed.

The secondary power supply parameters thus correspond to the above-mentioned secondary events.

The secondary power supply parameters comprise a measurement of the secondary phase current, a measurement of the secondary neutral current, and a measurement of the downstream voltage as made by the circuit breaker 2.

Thus, when the secondary processor component 28 of the circuit breaker 2 detects a current difference between the secondary phase current and the secondary neutral current that is greater than a predetermined current threshold, the secondary processor component 28 produces a secondary command for causing the line 3 to be opened or closed, and it controls the bistable relay 21 so as to open the cut-off member 20. In this example, the predetermined current threshold is equal to 500 milliamps (mA).

In the system of the invention, when powerline carrier communication is interrupted between the electricity meter 1 and the circuit breaker 2 for a duration greater than a predetermined duration, the secondary processor component 28 of the circuit breaker 2 considers that the electricity meter 1 is no longer capable of controlling the cut-off member 20 for a primary event. The secondary processor component 28 then decides itself to control the cut-off member 20 when a primary event occurs, and this continues until communication between the electricity meter 1 and the circuit breaker 2 has returned to normal.

It should be observed that by measuring the downstream voltage at the terminals of the electrical installation 5, the secondary voltage sensor of the circuit breaker 2 serves to detect a voltage generated by a power supply within the electrical installation 5. By way of example, the power supply may be a power supply unit that takes over in the event of a power cut.

It should also be observed that, in the event of the electricity meter 1 deciding to cause the cut-off member 20 of the circuit breaker 2 to open, the electricity meter 1 sends an opening alarm message to the data concentrator, which relays the message to the IS.

Likewise, in the event of the electricity meter 1 deciding to cause the cut-off member 20 of the circuit breaker 2 to close, the electricity meter 1 sends a closing alarm message to the data concentrator, which relays the message to the IS.

A refusal alarm message is also sent by the circuit breaker 2 to the electricity meter 1 when the circuit breaker 2 refuses to close the cut-off member 20 following a primary command for re-closing the cut-off member 20 as produced by the electricity meter 1. Such a refusal may occur when the circuit breaker 2 detects that an absolute value of the downstream voltage is greater than a predetermined voltage threshold, and thus that a power supply of the electrical installation 5 is generating the downstream voltage.

The circuit breaker 2 then refuses to re-close the cut-off member 20, since that would amount to short-circuiting the electricity distribution network 4 and the power supply of the electrical installation 5.

Figure 2:
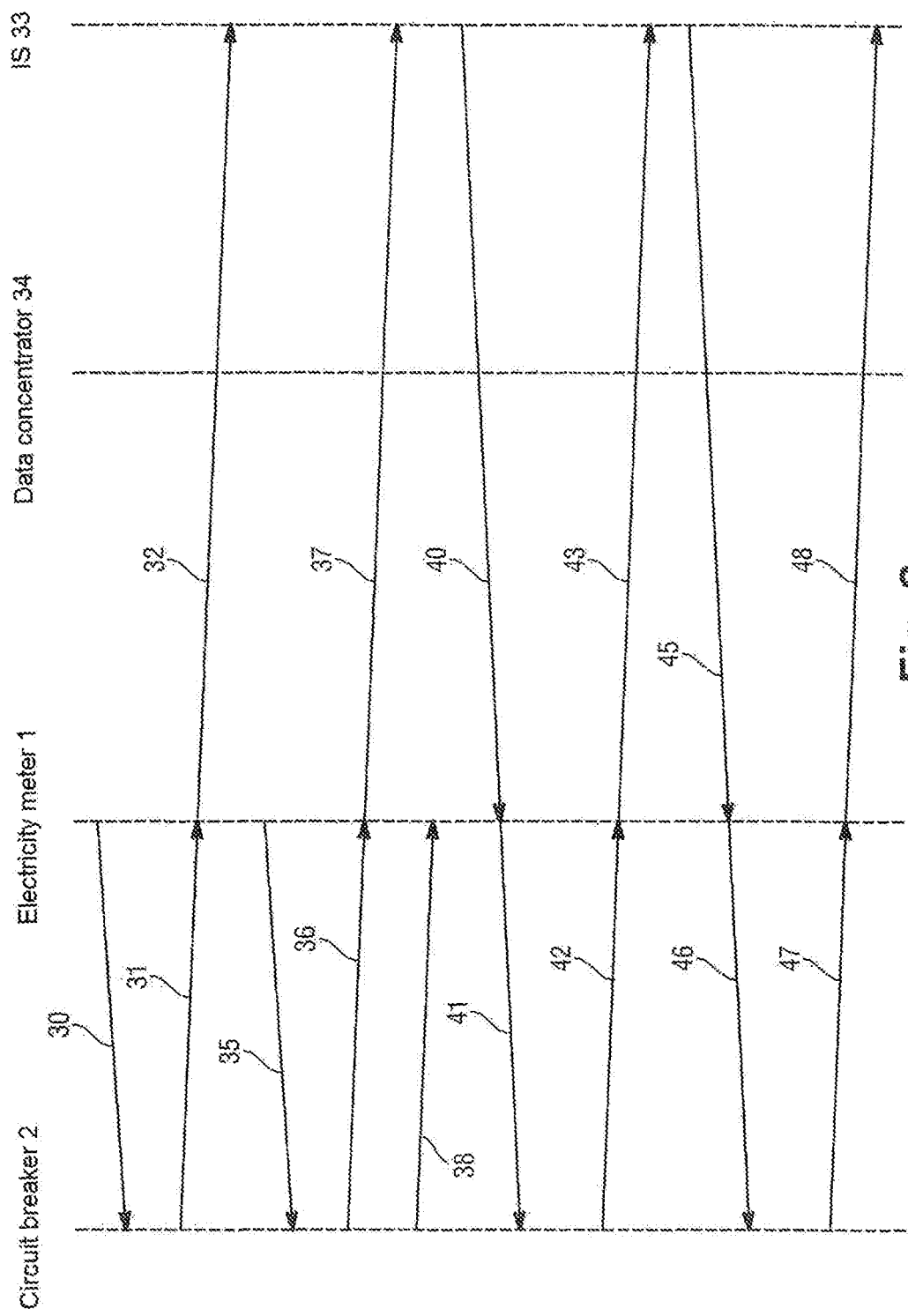
FIG. 2 shows the transmission of opening requests, of closing requests, and of primary orders for controlling opening or closing of the line.

With reference to FIG. 2, there follows an illustration of the operation of the system of the invention.

When the electricity meter 1 transmits a primary command 30 to the circuit breaker 2 in order to cause the line 3 to be opened, the circuit breaker 2 opens the line 3 and transmits an opening confirmation message 31 to the electricity meter 1. The electricity 1 then transmits an opening alarm message 32 to the IS 33 via the data concentrator 34.

When the electricity meter 1 transmits a primary command 35 to the circuit breaker 2 in order to cause the line 3 to be closed, the circuit breaker 2 closes the line 3 and transmits a closure confirmation message 36 to the electricity meter 1. The electricity meter 1 then transmits a closure alarm message 37 to the IS 33 via the data concentrator 34.

Nevertheless, when the circuit breaker 2 detects that the absolute value of the downstream voltage is greater than the predetermined voltage threshold, the circuit breaker 2 refuses to close the line 3 and sends a refusal alarm message 38 to the electricity meter 1.

When the IS 33 transmits an opening request 40 to the electricity meter 1 via the data concentrator 34, the electricity meter 1 produces a primary command 41 for causing the line 3 to be opened. The circuit breaker 2 opens the line 3 and transmits an opening confirmation message 42 to the electricity meter 1. The electricity 1 then transmits an opening alarm message 43 to the IS 33 via the data concentrator 34.

When the IS 33 transmits a closure request 45 to the electricity meter 1 via the data concentrator 34, the electricity meter 1 produces a primary command 46 for causing the line 3 to be closed. The circuit breaker 2 closes the line 3 and transmits an closing confirmation message 47 to the electricity meter 1. The electricity 1 then transmits a closing alarm message 48 to the IS 33 via the data concentrator 34.

Naturally, the invention is not limited to the embodiment described, but covers any variant coming within the ambit of the invention as defined by the claims.

Although a secondary transceiver is used in the circuit breaker in this example, it is entirely possible to implement the invention while using a secondary receiver instead of the secondary transceiver. By way of example, the secondary receiver (24) may then be a single band powerline carrier receiver operating over the second frequency band.

Naturally, under such circumstances, it is not possible for messages to be returned from the circuit breaker (at least not via the secondary receiver).

Although the system as described for the situation in which the line is a single phase line, the line could perfectly well be a three phase line. The circuit breaker would then be provided with three cut-off members (one per phase) controlled to operate simultaneously by a single command.

Although it is stated that, in order to pair the electricity meter and the circuit breaker, the serial number is transmitted by using the EURIDIS protocol, it is possible to make use of a different protocol. For example, use may be made of a "flag", which consists in placing a permanent magnet in the front face of the electricity meter, via which a connector communicates in optoelectronic manner with the electricity meter on the basis of the DLMS/COSEM/HDLC protocol.

As described herein, communication between the electricity meter and the circuit breaker is powerline carrier communication. Nevertheless, it is possible to make use of some other kind of communication (wired or wireless), and in particular radiofrequency communication, e.g. making use of the long-range (LoRa) protocol of the Wireless meter bus (WM-Bus) protocol.

As described herein, the electricity meter is located upstream from the circuit breaker, however the invention is applicable to a system in which the circuit breaker is situated upstream from the electricity meter.

Although various primary power supply parameters and various secondary power supply parameters are mentioned herein, it is not necessary for all of these parameters to be used, and it is also possible for other parameters to be taken into account.

The invention claimed is:

1. A system comprising an electricity meter and a circuit breaker, separate from and in communication with the electricity meter, for including in a line connecting an electricity distribution network to an electrical installation, the electricity meter comprising:
   a primary processor component arranged to acquire a primary power supply parameter relating to supplying power to the electrical installation, and, on the basis of the primary power supply parameter, to produce a primary command for controlling opening or closing of the line; and
   a primary transceiver arranged to transmit the primary command,
   wherein the circuit breaker comprises:
      a cut-off member for cutting off the line;
      a bistable relay arranged to open or to close the cut-off member;
      a secondary receiver arranged to receive the primary command;
      a secondary voltage sensor arranged to measure a downstream voltage downstream from the cut-off member; and
      a secondary processor component arranged to acquire the primary command and to control the bistable relay so as to open or close the cut-off member as a function of the primary command,
   wherein the primary power supply parameter comprises an opening request or a closing request produced by equipment external to the system and received by the primary processor component of the electricity meter via the primary transceiver, and
   wherein the circuit breaker is arranged to:
      measure the downstream voltage; and
      if the absolute value of the downstream voltage is greater than a predetermined voltage threshold, and if the primary command is for causing the line to be closed, refuse to close the line.

2. The system according to claim 1, wherein the primary power supply parameter further comprises a measurement of primary phase current, and/or a measurement of primary neutral current, and/or a measurement of primary voltage as taken by the electricity meter.

3. The system according to claim 1, wherein the primary transceiver is a powerline carrier transceiver and the secondary receiver is a powerline carrier receiver.

4. The system according to claim 3, wherein the primary transceiver is a two-band transceiver and the secondary receiver is a single-band receiver.

5. The system according to claim 1, wherein the circuit breaker includes a secondary voltage sensor arranged to measure a downstream voltage downstream from the cut-off member.

6. The system according to claim 1, including means for pairing the electricity meter and the circuit breaker.

7. The system according to claim 1, wherein the secondary processor component is also arranged to acquire a secondary power supply parameter relating to supplying power to the electrical installation, and, on the basis of the secondary power supply parameter, to produce a secondary command for causing the line to be opened or closed, and to control the bistable relay in such a manner as to open or close the cut-off member as a function of the secondary command.

8. A circuit breaker for including in a line connecting an electricity distribution network to an electrical installation, the circuit breaker comprising:
   a cut-off member for cutting off the line;
   a bistable relay arranged to open or to close the cut-off member;
   a secondary receiver arranged to receive a primary command as produced by an electricity meter included in the line on the basis of a primary power supply parameter;
   a secondary voltage sensor arranged to measure a downstream voltage downstream from the cut-off member; and
   a secondary processor component arranged to acquire the primary command and to control the bistable relay so as to open or close the cut-off member as a function of the primary command,
   wherein the primary power supply parameter comprises an opening request or a closing request produced by equipment external to the system and received by the primary processor component of the electricity meter via the primary transceiver, and
   wherein the circuit breaker is arranged to:

measure the downstream voltage; and if the absolute value of the downstream voltage is greater than a predetermined voltage threshold, and if the primary command is for causing the line to be closed, refuse to close the line.

9. The circuit breaker according to claim 8, wherein the secondary processor component is also arranged to acquire a secondary power supply parameter relating to supplying power to the electrical installation, and, on the basis of the secondary power supply parameter, to produce a secondary command for causing the line to be opened or closed, and to control the bistable relay in such a manner as to open or close the cut-off member as a function of the secondary command.

10. A monitoring method for monitoring a line connecting an electricity distribution network to an electrical installation, the monitoring method being performed in a circuit breaker according to claim 8, and the method comprising the steps of:

receiving, via the secondary receiver, a primary command for controlling opening or closing of the line;

controlling the bistable relay so as to open or close the cut-off member as a function of the primary command.

11. The monitoring method according to claim 10, further comprising the following steps:

measuring a downstream voltage downstream from the cut-off member;

if the absolute value of the downstream voltage is greater than a predetermined voltage threshold, and if the primary command is for causing the line to be closed, refusing to close the line.

12. A computer-readable storage medium storing a computer program including instructions for enabling the processor component of the circuit breaker to perform the monitoring method according to claim 10.

\* \* \* \* \*